(12) United States Patent
Cox et al.

(10) Patent No.: US 6,795,301 B2
(45) Date of Patent: Sep. 21, 2004

(54) DEVICE CONNECTING CARD

(75) Inventors: Allen Ronald Cox, Chandlers Ford (GB); Stephen Peter Legg, Warsash (GB)

(73) Assignee: International Business Machines Corporation, Armonk, NY (US)

( * ) Notice: Subject to any disclaimer, the term of this patent is extended or adjusted under 35 U.S.C. 154(b) by 53 days.

(21) Appl. No.: 10/150,274

(22) Filed: May 17, 2002

(65) Prior Publication Data
US 2003/0063436 A1 Apr. 3, 2003

(30) Foreign Application Priority Data
Oct. 3, 2001 (GB) .............................................. 0123677

(51) Int. Cl.⁷ ................................................ H05K 5/00
(52) U.S. Cl. ................... 361/679; 312/223.4; 369/75.2; 360/98.01
(58) Field of Search ................................. 361/679–687, 361/724–727; 312/223.1–223.6; 369/75.1, 82; 360/97.01, 98.01, 137, 137 D

(56) References Cited

U.S. PATENT DOCUMENTS

| | | | |
|---|---|---|---|
| 5,563,400 A | * 10/1996 | Le Roux | 235/486 |
| 5,611,057 A | * 3/1997 | Pecone et al. | 710/301 |
| 5,822,184 A | * 10/1998 | Rabinovitz | 361/685 |
| 6,185,093 B1 | * 2/2001 | Moss | 361/684 |
| 6,233,143 B1 | * 5/2001 | Gamble et al. | 361/685 |
| 6,567,266 B2 | * 5/2003 | Ives et al. | 361/685 |

* cited by examiner

Primary Examiner—Hung Van Duong
(74) Attorney, Agent, or Firm—Randall J. Bluestone; Harrington & Smith, LLP

(57) ABSTRACT

The invention relates to an enclosure comprising a housing and a device connecting card which is compliantly connected within the housing. The compliant connection, in use, disperses mounting stresses caused by a device in the housing.

32 Claims, 5 Drawing Sheets

DEVICE CONNECTING CARD

FIELD OF THE INVENTION

The present invention relates to the field of data processing systems, and more particularly to the location of devices within such systems.

BACKGROUND OF THE INVENTION

Many current mid to high-end computer systems (e.g., network servers) include mass storage devices (hard files) configured as an array, and one common configuration places the computer system and array in a loop enabling bi-directional data transfer between the two.

With reference to FIG. 1, each hard file 10 is typically held in a carrier device 20 for insertion into the computer housing (not shown) using rails 30 on the carrier 20. The carrier device also has a latch 40 such that it can be locked into place within the computer housing.

FIG. 2a shows the inside of a computer housing 60 which is specially adapted to receive the carrier device shown in FIG. 1. The rails 20 of the carrier device engage with a set of rails 70 inside the computer housing and enable the carrier to be slid into place. FIG. 2b shows an enlarged view of the inside of computer housing 60 and FIG. 3 shows hard file 10 in its carrier 20 being inserted into place within computer housing 60.

At the end of the rails 70 inside the computer housing sits a backplane which spans the length of the computer system box. FIG. 4 shows a backplane 80 of the prior art which includes a plurality of female connectors 90 and some logical circuitry 95 for carrying out computing function. On the back of the hard file is a male connector (not shown). The carrier device containing the hard file is slid down the computer system's rails towards the backplane until the male connector engages with the appropriate female connector on the backplane. This connection usually takes the form of one of the industry-standard protocols such as SCSI (Small Computer Systems Interface) or SSA (Serial Storage Architecture).

The docking of the hard file with the backplane is a very precise art. The backplane is fixed, whilst the hard file has limited movement within the carrier device. The misalignment of the hard file connector with the backplane connector can frequently be up to 0.7 mm and when such a misalignment occurs, it is necessary to force the hard file connector into the correct position before docking can take place. The carrier is locked into position using latch 40 and this latch aids in forcing the two connectors to engage.

The backplane is an expensive piece of equipment. During the forced docking of a hard file thereon, it is highly likely that the backplane may be over stressed by such forcing, resulting in the failure of one or more of its connectors or circuitry (components). Failure of even a single backplane connector requires the computer system to be shut down in order for the entire backplane to be replaced. This is highly inconvenient for customers who typically expect high data availability.

Further whilst the carrier device is locked in place, the hard file connector is prone to some degree of movement. The environment in which the computer system is place may be the cause of this (e.g., outside resonance). This too can lead to the backplane becoming stressed and damaged, requiring complete replacement thereof.

DISCLOSURE OF THE INVENTION

Accordingly, the invention provides an enclosure comprising: a housing; and a device connecting card compliantly connected within the housing, whereby in use the compliant connection disperses mounting stresses caused by a device in the housing.

According to a preferred embodiment, the connection is laterally compliant.

In a preferred embodiment, the compliant connection comprises an electrical connection. In the prior art the electrical connection typically is a male/female connection which can easily become stressed due to movement of the connecting device during operation thereof (this may be caused by the environment in which the enclosure is placed (e.g. outside resonance). Use of a compliant connector means that such stress does not occur.

Preferably the compliant connection is resilient in order to provide an dampening effect (e.g., on operational vibrations of a hard file.)

In one embodiment, the electrical connection comprises a backplane, pressure connector means provided on a first face of the card and contacts provided on the face of the backplane which is opposite the first face of said card. It is the pressure connector means being in contact with the contacts on the backplane which form the electrical connection between the card and the backplane. The use of pressure connectors is also particularly advantageous because there are no connector pins which could become damaged by, for e.g., outside resonance/vibrations (e.g. such vibrations may cause the device connected to the card to move and this could have previously resulted in damage to the connector pins). Further the compliant connector is tolerant of movement of the card with respect to the backplane and does not break electrical contact with the contacts on the backplane when such movement occurs.

Preferably the contacts are conductive pads. These may, for example, be made of gold plated copper. The pads should be chosen such that they do not easily rust.

Preferably the card is dimensioned to provide a greater surface area than the backplane. This means it is possible to provide a greater degree of functionality on the card than would previously have fitted onto the backplane. For example, extra memory could be added.

In a preferred embodiment, the compliant connection comprises a mechanical connection. The lateral movement preferably permitted by the mechanical connection allows, for example, a connector on the card to align itself with a connector on the back of a device due to engage therewith. It is no longer necessary to force, for example, a hard file connector to dock with the connector on the card. Thus greater assembly tolerances are permitted with regard to the construction of the hard file, its carrier, and the rails by which the carrier engages with the data processing system. A greater degree of misalignment between the hard file connector and the connector on the card is therefore permitted.

In one embodiment the mechanical connection comprises a stud, an aperture in the backplane for receipt of the stud and means for attaching the stud to the backplane. It is a clearance formed between the stud and the card's aperture which permits laterally compliant movement of the card with respect to the backplane.

The mechanical connection means preferably comprises means for maintaining the card at a controlled distance from the backplane (e.g. the stud). This distance enables an improved flow of across any components on the card to be provided for, enabling improved cooling of such components. The mechanical connection preferably also comprises locking means.

It will be appreciated that the invention is not limited to the use of a stud based mechanical connection. In one embodiment the mechanical connection comprises laterally compliant pillars which could be soldered to the first face of the card and also to the backplane.

Preferably the card has at least one of electrical conversion means and protocol conversion means. For example, the electrical conversion means can make the conversion between single-ended and differential current or between two different voltages. The protocol conversion means could make the conversion between a SCSI hard file and an SSA data processing system.

In a preferred embodiment, the card comprises circuitry for performing computing functions. Of course such circuitry could instead be located on the backplane. However the soldering of components onto the backplane causes it to undergo many temperature changes. Such changes may result in damage occurring to other components on the backplane. By soldering the components onto the card, there is less scope for damage. In any case, the card can be replaced instead of the entire backplane.

Preferably a connector is located on the second face of the card in order for a connector on a device such as a hard file to be able to engage therewith. As previously mentioned, during engagement such a device with a connector on the backplane it was latterly highly likely that the connector/ other components thereon would be over stressed and fail. The connector on the backplane/other components could also become stressed due to outside resonance/vibrations etc. Such a failure resulted in the need to replace the entire backplane—a very expensive piece of equipment. Moving the connector onto the card permits replacement of this card rather than the entire backplane. This is therefore extremely advantageous. Likewise, by moving other components previously on the backplane onto the card, only the card should have to be replaced if any of those components fail.

According to another aspect, the invention provides a device connecting card having a compliant connection for mounting the card within an enclosure, whereby in use the compliant connection disperses mounting stresses caused by a device in the enclosure.

BRIEF DESCRIPTION OF THE DRAWINGS

A preferred embodiment of the present invention will now be described, by way of example only, and with reference to the following drawings.

DESCRIPTION OF THE PREFERRED EMBODIMENTS

Figure 1:
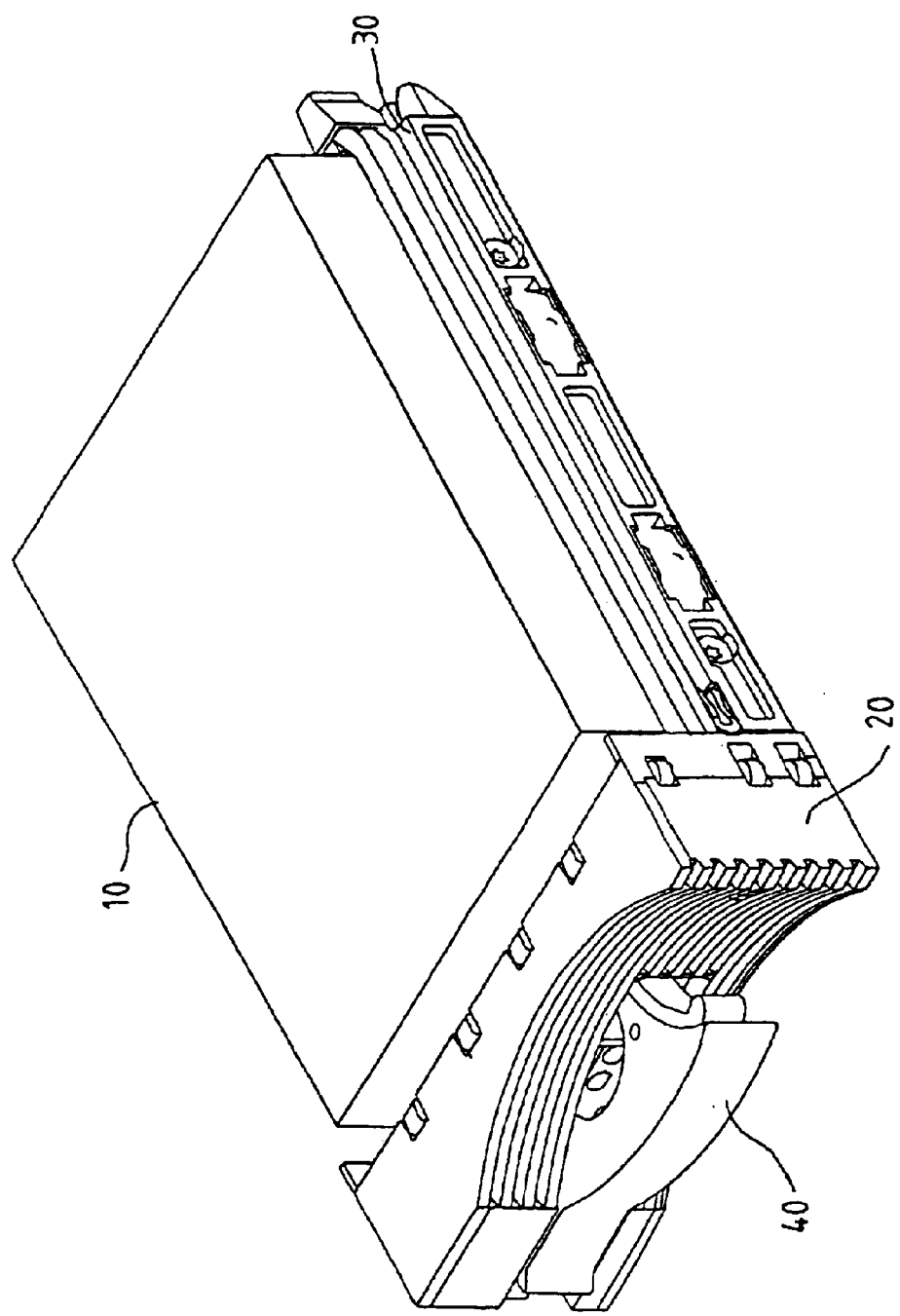
FIG. 1 shows a hard file mounted within a carrier device in accordance with the prior art.
Figure 2A:
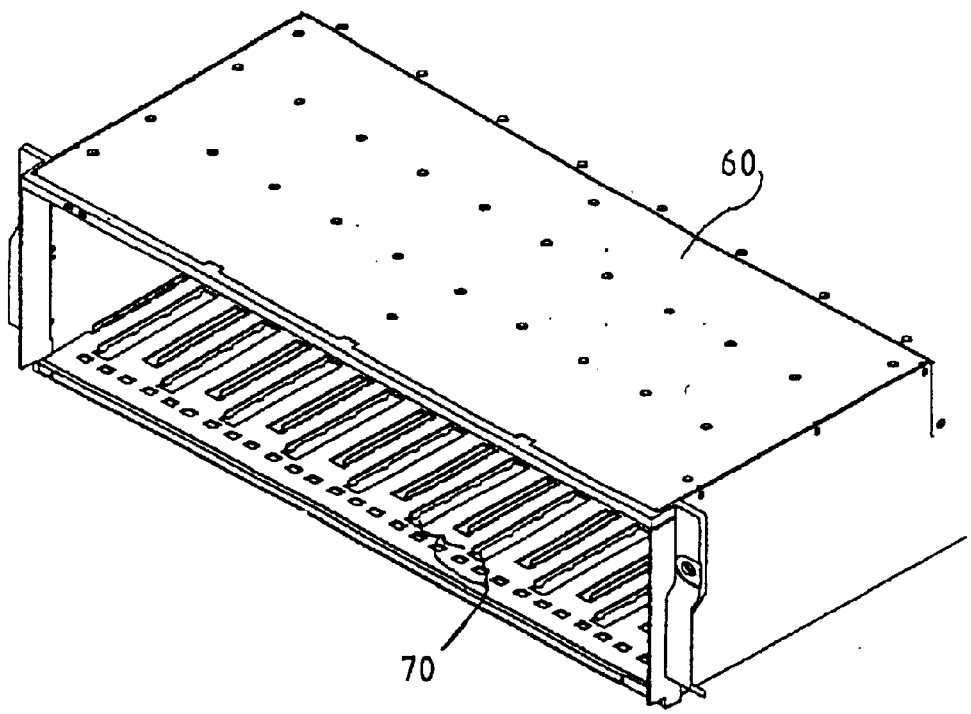
FIGS. 2a and 2b show the interior of a computer housing in accordance with the prior art.
Figure 2B:
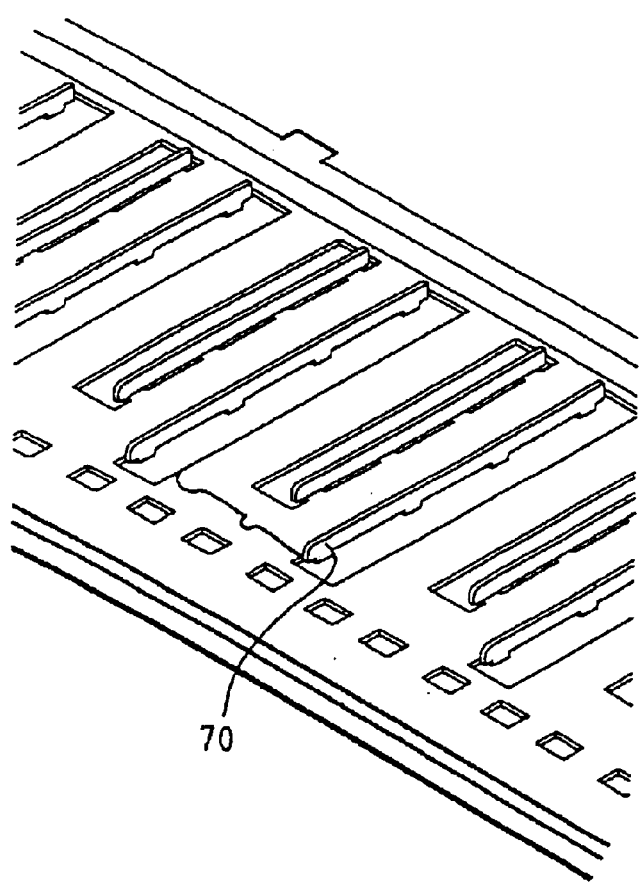
Figure 3:
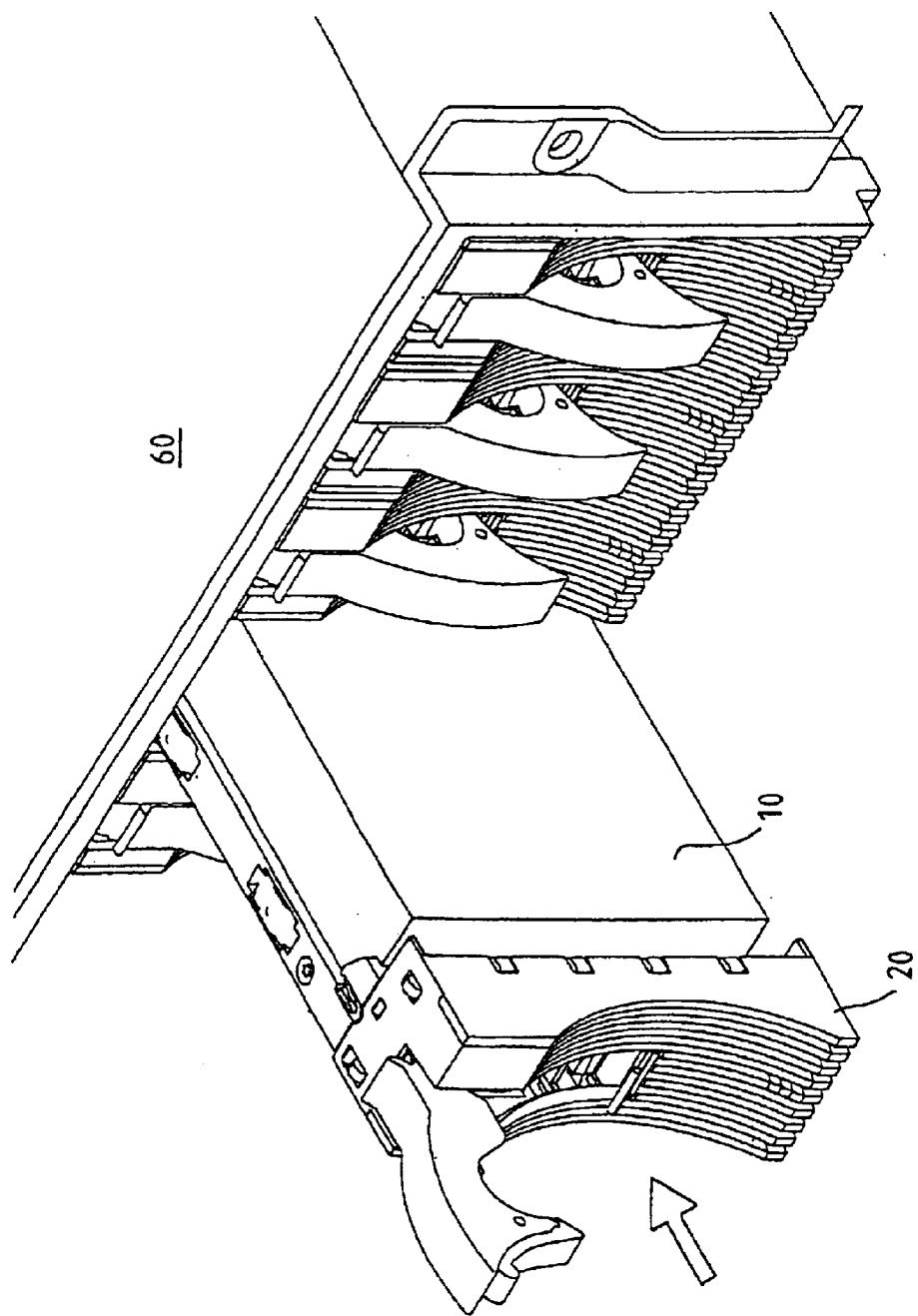
FIG. 3 shows the hard file of FIG. 1 partially inserted into the housing of FIGS. 2a and 2b.
Figure 4:
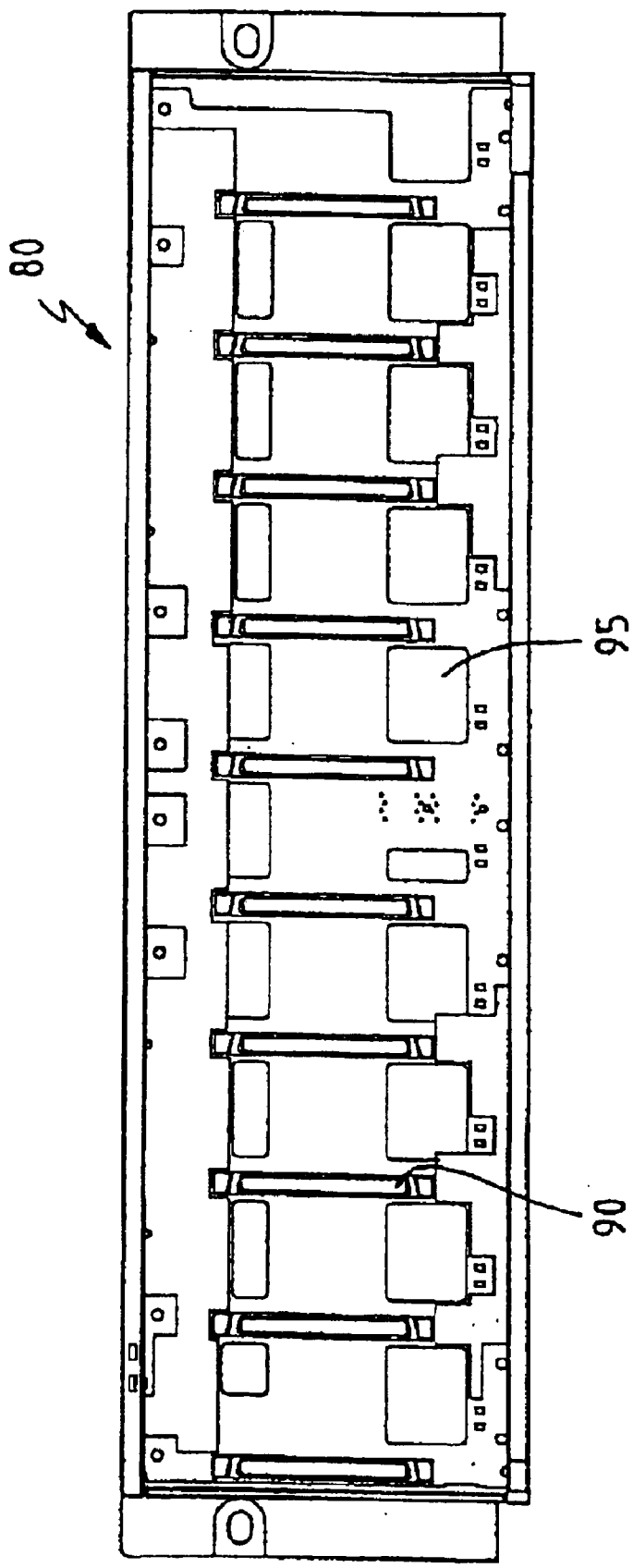
FIG. 4 shows a backplane in accordance with the prior art.
Figure 5:
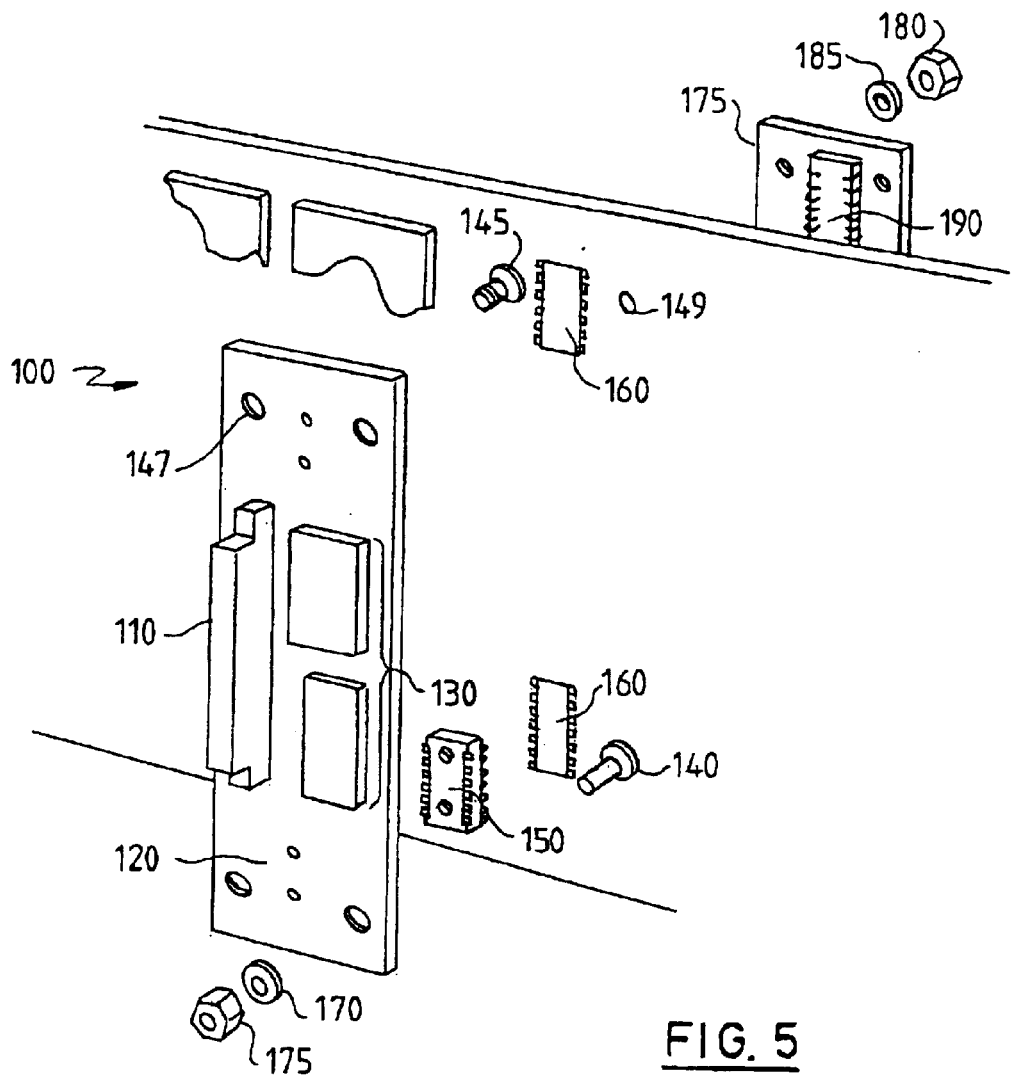
FIG. 5 shows a preferred embodiment of the present invention.

With reference to FIG. 5 and in accordance with a preferred embodiment, a backplane 100 is provided with minimal electronic assembly (see below) and no docking connectors for plug-in devices such as hard files. Each connection between a hard file and the computer system into which it is fitted is made via a standard connector 110 but rather than being located on the backplane, this connector sits on an interposer card 120. The interposer card also has circuitry (components) 130 thereon for performing computing functions. It will be appreciated that previously such circuitry was located on the backplane. Preferably there is one interposer card per hard file connection, although the invention is not limited to such and one card may contain more than one connector.

The card 120 is retained at a controlled distance (e.g., 2.6 mm) from the backplane by stepped studs 140, 145 (preferably four as alluded to in the diagram) fitted through appropriate apertures 149, 147 in the backplane and in the interposer card and each held in place by a nylon (slip) washer 170 and a lock nut 175 (could be a snap plastic moulding). This controlled space allows for two low profile pressure contact connectors 150 (one shown) affixed to the underside of the interposer card to make contact with a set of copper pads 160 on the backplane in order to carry the electronic signals between the backplane and the interposer card. The variation in tolerances in the case supporting the backplane and in the individual hard file carriers provides a wiping motion between the copper pads and the pressure connectors to ensure a good contact. The backplane preferably therefore contains only copper pads and copper lines for connecting sets of copper pads to enable communication between a plurality of hard file devices.

It will be seen from the figure that a double-sided assembly is possible, with a second interposer card 175 provided on the second side of backplane 100. This second card has the same configuration as the first with two pressure connectors (one shown) 190 for making contact with copper pads on the second side of the backplane. As with the first card 120, it is held at a controlled distance from the backplane via the stepped stud 145 and this is held in place via lock nut 180 and nylon (slip) washer 185.

Whilst a double-side assembly is shown, it will be appreciated that the invention is not limited to such and that only one side of the backplane may be adapted to support an interposer card(s).

Figure 6:
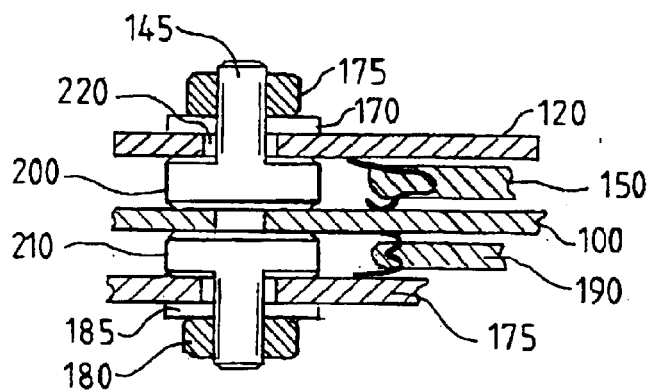
FIG. 6 shows the way in which the interposer card is fastened to the backplane according to a preferred embodiment of the present invention.

FIG. 6 shown the attachment of the interposer cards 120, 175 to the backplane in more detail. Backplane 100 has a number of apertures formed therein, each for receipt of a stepped stud 145 by which interposer cards 120 and 175 are held in place. There may for example be four stepped studs per interposer card, although no limitation in this regard is intended. A first step 200 in the stud holds card 120 at a controlled distance from a first side of the backplane and a second step 210 holds card 175 at a controlled distance from the second side of the backplane. These controlled distances may be, for example, 2.6 mm. Each free end of the stepped stud is fixed in place via a lock nut 175, 180 and a nylon washer 170, 185 as previously discussed. Pressure pads 150 and 190 (only one per interposer card shown), attached to the underside of cards 120 and 175 respectively, make contact with copper pads on the backplane in order to carry electronic signals between the backplane and the respective interposer card. (Note, whilst two pressure pads are specified in the embodiment no limitation in this regard is intended.)

Each interposer card is attached to the backplane in such a way so as to allow it to self align to the connector on the back of the hard file. This alignment movement is achieved in the preferred embodiment by the card mount which will allow lateral movement controlled by the clearance in each mounting hole 220. In other words the fit of each interposer card to the stepped stud is not a tight one and allows for movement of the interposer card. The clearance on each side of the stepped stud may for example be 1 mm.

As previously alluded to, the lateral movement permitted by the clearance in the mounting holes reduces the need to apply force in order to get the connector on the hard file to align and engage with its corresponding connector in the computer system. Instead the interposer card is able to move into a position such that precise engagement with the hard file connector is possible.

Whilst the alignment is achieved in the preferred embodiment by the clearance of the card mount in the mounting holes, the invention is not limited to such. For example, laterally compliant pillars attached to the underside of the interposer card and also to the backplane would achieve the same effect.

According to the preferred embodiment, the invention has the following advantages:

i) The cost of the backplane itself is reduced because the connectors and circuitry are moved onto the individual interposer cards.
ii) The reliability of the backplane is improved because the main components are now located on the interposer cards. Should a component/connector fail then the card upon which that component/connector sits can be individually replaced in the field without the need to shut the computer system down and replace the entire backplane. Mass storage arrays are such that a failed device can be bypassed without bringing the whole system to a standstill. Thus replacement of an interposer card whilst the remainder of the machine remains operational is perfectly possible. This therefore represents a huge cost saving.
iii) Further, from time to time connectors/components may require updating. It is now possible to perform updates to) single cards in the field without shutting the whole system down and having to replace the whole backplane. Even if all cards are to be replaced, this can be done one by one whilst the remainder of the machine remains operational, due to the system's ability to bypass those storage devices that aren't working.
iv) The interposer card can be dimensioned to have a larger surface area than the backplane (for example across the backplane's width). This means that there is more space available, than was previously the case, for additional functionality to be added (e.g., more memory).
v) The controlled space between the interposer card and the backplane, which is achieved by the card mount, provides for improved air flow for cooling components on the interposer card.
vi) More robust assembly tolerances can be used. This is because the alignment between a backplane connector and a hard file connector does not need to be so precise due to the floating nature of the interposer card. This reduces costs.
vii) The stress between the backplane and the hard file connectors will be minimised as the parts take up their own nominal position. Thus the fact that once the carrier device is locked in place the hard file may be prone to some degree of movement, is not such a concern because the interposer card can move with the hard file. Therefore the interposer card and the connectors/components thereon are not subject to the same degree of stress as a backplane of the prior art is likely to be.
viii) The alignment card can do the same job as a prior art interposer card, in that it may provide for electrical conversion; and/or protocol conversion.

It will be appreciated that whilst the invention has been described in terms of a hard file connection within a computer system, the invention is not limited to such. Rather the invention is applicable to any device interfacing via a connector to a data processing system (e.g. a bank of cards plugging into a telephone exchange).

To summarise, an enclosure is disclosed which comprises a housing and a device connecting card which is compliantly connected within the housing. The compliant connection, in use, disperses mounting stresses caused by a device in the housing.

What is claimed is:

1. An enclosure comprising:
    a housing;
    a backplane;
    at least one contact pad affixed to said backplane, said contact pad providing a compliant connection within said housing, and
    a device connecting card compliantly connected to the backplane via the at least one contact pad within the housing.

2. The enclosure of claim 1, wherein the compliant connection is laterally compliant.

3. The enclosure of claim 1, wherein the compliant connection comprises an electrical connection.

4. The enclosure of claim 1, wherein the compliant connection comprises a mechanical connection.

5. The enclosure of claim 1, wherein the card comprises: electrical conversion means.

6. The enclosure of claim 1, wherein the card comprises: protocol conversion means.

7. The enclosure of claim 1, wherein the card comprises: circuitry for performing computing functions.

8. The enclosure of claim 1, comprising a connector on the second face of said card.

9. The enclosure of claim 3, wherein said electrical connection is resilient.

10. The enclosure of claim 4, wherein the compliant mechanical connection comprises means for maintaining the card at a controlled distance from the backplane.

11. The enclosure of claim 4, wherein the mechanical connection further comprises locking means.

12. An enclosure comprising:
    a housing;
    a backplane;
    a device connecting card having a compliant connection within the housing,
    wherein the compliant connection comprises an electrical connections,
    pressure connector means provided on a first face of the card; and
    contacts provided on the face of the backplane which is opposite the first face of said card, the pressure connector means and the contacts forming the electrical connection between the card and the backplane.

13. The enclosure of claim 12, wherein the contacts comprise conductive pads.

14. The enclosure of claim 12, wherein said card is dimensioned to provide a greater surface area than the backplane.

15. The enclosure of claim 12, wherein the compliant connection comprises a mechanical connection including:
    a stud;
    an aperture in the backplane for receipt of said stud; and means for attaching the stud to the backplane, wherein a clearance formed between the stud and the card's aperture permits laterally compliant movement of the card with respect to the backplane.

16. A device connecting card having a compliant connection for mounting the card within an enclosure, whereby in use the compliant connection disperses mounting stresses caused by a device in the enclosure.

17. The card of claim 16 wherein the connection is laterally compliant.

18. The card of claim 16, wherein the compliant connection comprises a mechanical connection.

19. The card of claim 16, wherein the compliant connection comprises an electrical connection.

20. The card of claim 19, wherein said electrical connection is resilient.

21. The card of claim 16, comprising a connector on a second face.

22. The card of claim 16, comprising:

circuitry for performing computing functions.

23. A device connecting card having a compliant connection for mounting the card within an enclosure, wherein the compliant connection comprises an electrical connection;

wherein the electrical connection comprises pressure connector means provided on a first face of the card for making contact with contacts provided on the face of a backplane opposite the first face of said card in use, the pressure connector means forming the electrical connection with the contacts.

24. The card of claim 23 being dimensioned to provide a greater surface area than the backplane.

25. A mass storage unit, comprising:

a backplane;

at least one hard file; and a connection system for electrically and mechanically coupling said at least one hard file to said backplane, said connection system comprising an interposer card that comprises on a first surface a connector for mating with a connector of said hard file, and on a second, opposite surface pressure connector means for mating with a set of electrically conductive pads disposed on a first major surface of said backplane that is opposed to said second surface of said interposer card and that is spaced apart therefrom by spacer means.

26. A mass storage unit as in claim 25, where said interposer card is mounted on said spacer means for enabling lateral motion of said interposer card for facilitating a plug-in mating action with said hard file.

27. A mass storage unit as in claim 25, where a second connection system is electrically coupled to a second set of electrically conductive pads disposed on a second major surface of said backplane that is opposite to said first major surface.

28. A mass storage unit as in claim 25, and further comprising circuitry disposed on said interposer card, said circuitry being electrically coupled to signal lines passing through said connectors.

29. A mass storage unit as in claim 25, where there are a plurality of hard files and, for individual ones of said plurality of hard files, one of said interposer cards for electrically and mechanically coupling said individual one of said hard files to said backplane.

30. A method for electrically and mechanically connecting a hard file to a backplane, comprising:

providing an interposer card that comprises on a first surface a connector for mating with a connector of said hard file, and on a second, opposite surface a pressure connector means for mating with a set of electrically conductive pads disposed on a first major surface of said backplane;

mounting said interposer card onto standoffs from said first major surface of said backplane for urging said pressure connector means against said electrically conductive pads, and mating said interposer card connector to said hard file connector, where said interposer card is mounted on said standoffs for enabling lateral motion of said interposer card for facilitating the mating action of said interposer card connector with said hard file connector.

31. A method as in claim 30, where a second interposer card is electrically coupled to a second set of electrically conductive pads disposed on a second major surface of said backplane that is opposite to said first major surface.

32. A method as in claim 30, and further comprising operating circuitry disposed on said interposer card, said circuitry being electrically coupled to signal lines passing through said connectors.

* * * * *